(12) United States Patent
Aikawa et al.

(10) Patent No.: US 7,203,608 B1
(45) Date of Patent: Apr. 10, 2007

(54) IMPEDANE MEASUREMENT OF CHIP, PACKAGE, AND BOARD POWER SUPPLY SYSTEM USING PSEUDO IMPULSE RESPONSE

(75) Inventors: Makoto Aikawa, Tokyo (JP); Sang Hoo Dhong, Austin, TX (US); Brian Flachs, Georgetown, TX (US); Paul Marlan Harvey, Austin, TX (US); Brad William Michael, Cedar Park, TX (US); Yaping Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/424,613

(22) Filed: Jun. 16, 2006

(51) Int. Cl.
*G01R 27/28* (2006.01)
(52) U.S. Cl. ...................................... 702/57
(58) Field of Classification Search ................ 702/57, 702/189; 324/1; 700/286
See application file for complete search history.

(56) References Cited

U.S. PATENT DOCUMENTS 6,768,952 B2 * 7/2004 Kantorovich et al. ......... 702/65
6,911,827 B2   6/2005 Kantorovich et al.

* cited by examiner

*Primary Examiner*—John Barlow
*Assistant Examiner*—Tung S. Lau
(74) *Attorney, Agent, or Firm*—Duke W. Yee; Diana R. Gerhardt; Cathrine K. Kinslow

(57) ABSTRACT

A method for measuring impedance of a microprocessor chip, electronic packaging, and circuit board power supply system by generating a pseudo-impulse current having a width size in the time domain not larger than the inversion of a maximum frequency of interest and obtaining a voltage measurement in a frequency domain of the pseudo-impulse current. The mechanism of the present invention then predicts the normalized Fourier transformation of the current in the frequency domain, wherein the normalized Fourier transformation depends upon a switching charge of the pseudo-impulse current, measures the switching charge of the pseudo-impulse current, obtains a first current measurement at zero frequency using the measured switching charge, and obtains a second current measurement at a frequency of interest using the first current measurement. The mechanism of the present invention then calculates the impedance of the chip/package/board power supply system using the voltage measurement and the second current measurement.

20 Claims, 4 Drawing Sheets

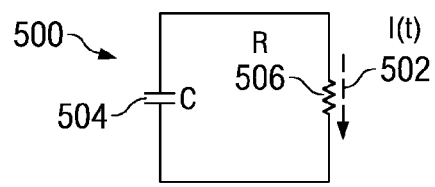
*FIG. 5*
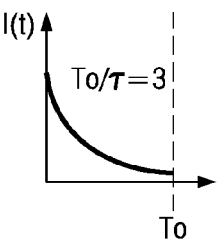
*FIG. 6A*
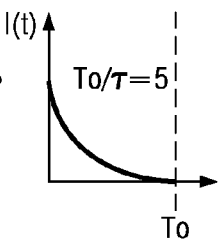
*FIG. 6B*
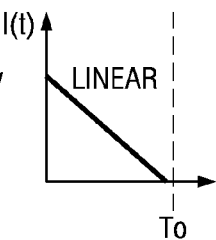
*FIG. 6C*
*FIG. 7*
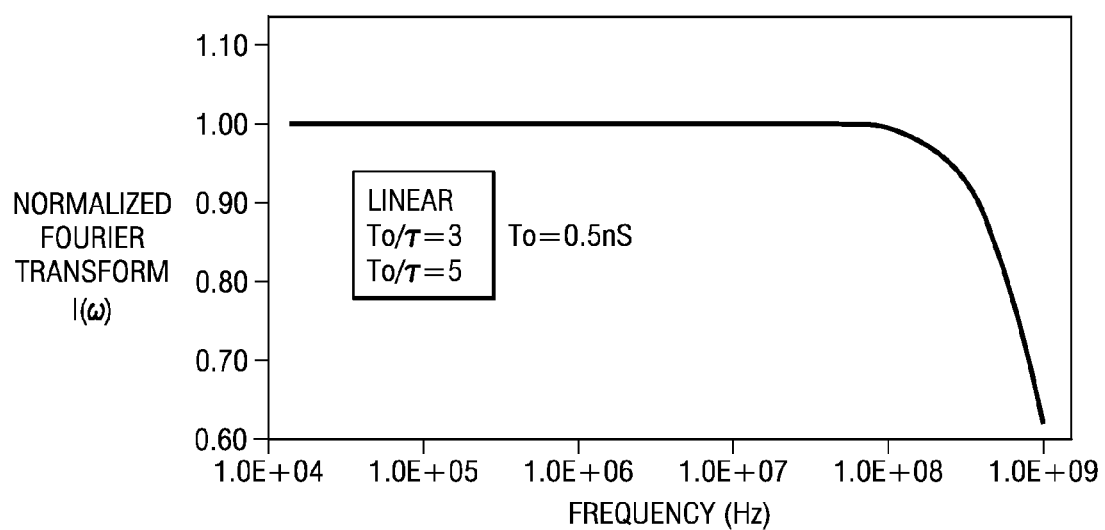
*FIG. 8A*
*FIG. 8B*
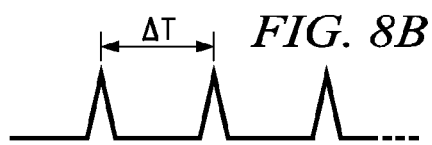

IMPEDANE MEASUREMENT OF CHIP, PACKAGE, AND BOARD POWER SUPPLY SYSTEM USING PSEUDO IMPULSE RESPONSE

BACKGROUND

1. Field of the Invention

The present application relates generally to integrated circuits, and in particular, to a computer implemented method, data processing system, and computer program product for measuring impedance of microprocessor chips, circuit boards, and electronic packaging using a pseudo-impulse response.

2. Description of the Related Art

Improvements in manufacturing processes are enabling integrated circuit devices to offer more functionality as the size of individual transistors contained therein get smaller and smaller, thus allowing more transistors to be packaged within an integrated circuit device. Integrated circuits (also called chips) are coupled to a substrate utilizing an integrated circuit package. The package is responsible for supplying power to the integrated circuit, and physically supplying the circuit's signals out of the chip to the circuit board.

As the trend of integrating more functions in a single high performance integrated circuit device continues, the on-chip noise condition due to switching activity on the chip has become a challenge. High frequency noise can hinder desired increases in clock cycle time as well as reliability improvements for these highly integrated systems on a chip. To optimally mitigate noise due to switching activity on the chip, impedance in the chip/package/board power supply system may be measured to assist in determining the origins of the noise and optimizing the design of the system. Impedance is a crucial parameter for determining the workloads or switching charge activity that a microprocessor can tolerate without causing any logic problems. However, measuring the impedance can be difficult since the impedance in modern microprocessor chips is small, the impedance in the frequency range of interest is broad (e.g., ~kHz to 1 GHz), and there is no one localized point to measure the current of the chip/package/board to obtain the impedance.

There currently are methods in the art for measuring the impedance in power supply systems. Examples of such methods are described in U.S. Pat. No. 6,768,952 B2 to Kantorovich et al. and in U.S. Pat. No. 6,911,827 B2 also to Kantorovich et al. The '952 and '827 patents both disclose measuring impedance by determining the transition between current levels to generate a periodic current waveform, and taking multiple measurements of the voltage of the system in the time domain to obtain a plurality of sets of voltage measurements. The methods remove clock frequency-dependent noises to generate a filtered average voltage (since the clock speed is known, the position in the time domain where the clock signal will repeat is also known, thereby allowing for the determination of where the voltage peak occurs and consequently the removal of the to form a filtered average voltage). The methods then determine the impedance by dividing a Fourier component of the filtered average voltage by a Fourier component of a periodic current waveform.

However, the impedance-measuring techniques in the Kantorovich patents contains several drawbacks, such as requiring one to perform manual filtering processes to remove noise, as well as requiring that multiple measurements be taken of the current at various frequencies. For instance, the Kantorovich techniques measure the transition between two very active states, resulting in a lot of noise that needs to be filtered out. The Kantorovich patents disclose "removing the clock frequency-dependent noises to generate a filtered average voltage". However, the manual filtering proposed by the Kantorovich patents may potentially change the frequency spectrum. In other words, if an element is removed from the time domain, it may not be possible to known the impact the removal will have on the frequency domain.

Therefore, it would be advantageous to have an improved method for measuring impedance of microprocessor chips, circuit boards, and electronic packaging.

SUMMARY

Embodiments of the present invention provide a computer implemented method, data processing system, and computer program product for measuring the frequency-domain impedance of a microprocessor chip, electronic packaging, and circuit board power supply system using a pseudo-impulse response. The mechanism of the present invention generates a pseudo-impulse current having a width size in the time domain not larger than the inversion of a maximum frequency of interest and obtains a voltage measurement in a frequency domain of the pseudo-impulse current. The mechanism of the present invention then predicts the normalized Fourier transformation of the current in the frequency domain, wherein the normalized Fourier transformation depends upon a switching charge of the pseudo-impulse current. The mechanism of the present invention measures the switching charge of the pseudo-impulse current, obtains a first current measurement at zero frequency using the measured switching charge, and obtains a second current measurement at a frequency of interest using the first current measurement. The mechanism of the present invention then calculates the impedance of the chip/package/board power supply system using the voltage measurement and the second current measurement.

BRIEF DESCRIPTION OF THE DRAWINGS

The novel features believed characteristic of the illustrative embodiments are set forth in the appended claims. The illustrative embodiments themselves, however, as well as a preferred mode of use, further objectives and advantages thereof, will best be understood by reference to the following detailed description of the illustrative embodiments when read in conjunction with the accompanying drawings, wherein:

FIG. 5 is a diagram of an RC circuit;

FIGS. 6A–6C are graphs illustrating Fourier spectrums of example pseudo-impulses in accordance with an illustrative embodiment of the present invention;

FIG. 7 is a graph illustrating an exemplary normalized Fourier Spectrum of a pseudo-impulse in accordance with an illustrative embodiment of the present invention;

FIGS. 8A–8B illustrate example pseudo-impulse cycles in accordance with an illustrative embodiment of the present invention;

DETAILED DESCRIPTION OF THE PREFERRED EMBODIMENT

Embodiments of the present invention provide a computer implemented method, data processing system, and computer program product for measuring the impedance profile of a microprocessor chip, electronic packaging, and circuit board power supply system using a pseudo-impulse response. Impedance is measured as the product of the voltage and the current in the frequency domain, or $$Z(f) = V(f)/I(f)$$

wherein $Z(f)$ is impedance, $V(f)$ is voltage, and $I(f)$ is current.

To obtain a value for the voltage $V(f)$, the mechanism of the present invention first designs a switching event that can be repetitive and can generate a pseudo-impulse current of narrow but finite width in the time domain. The mechanism of the present invention then generates the desired switching event, which in turn generates the pseudo-impulse current of narrow width. An example of a current-producing mechanism is a Logic Built-in Self Test (LBIST) scan shift technique, which is described in detail in FIG. 4 below. Sense pairs connected to the chip and separated from the power and ground monitor the on-chip voltage by using an oscilloscope to measure the voltage of the pseudo-impulse in the time domain $V(t)$. A Fourier transformation of $V(t)$ performed by the oscilloscope or by post-processing the measured $V(t)$ data results in obtaining the voltage in the frequency domain $V(f)$.

To obtain a value for the current $I(f)$, the mechanism of the present invention first predicts the normalized Fourier transformation of the current $I(f)/I(0)$. The normalized Fourier transformation of the current is predictable due to the fact that the pseudo-impulse current has a narrow width in the time domain, and thus any current used that has such a narrow width will not have significant differences in the waveform assumptions, as will be shown in FIGS. 6A–7. The predicted normalized Fourier transformation of the current $I(f)/I(0)$ is dependent upon the switching charge $Q_0$ of the pseudo-impulse. The mechanism of the present invention measures the switching charge $Q_0$ by repeating the pseudo-impulse and measuring the change in current $\Delta I$ within a particular time period $\Delta T$.

Using the measured switching charge, the mechanism of the present invention obtains the Fourier transformation of the current at zero frequency $I(0)$ (i.e., direct current (DC)). As the current $I(f)/I(0)$ is known and $I(0)$ is measured, the current $I(f)$ at any frequency of interest (~100 kHz to ~1 GHz) may be obtained. The mechanism of the present invention may then determine the impedance profile $Z(f)$ of the chip/package/board system using the impedance equation $Z(f) = V(f)/I(f)$. The impedance profile allows one to understand the origins of and control the power supply noise. The impedance profile may also be used to assist in the design or optimization of the on-chip decoupling, package decoupling, and circuit board decoupling for noise reduction.

Figure 1:
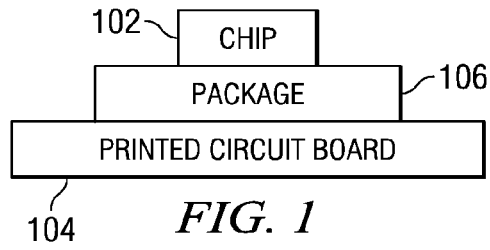
FIG. 1 is a block diagram of an integrated circuit coupled to a printed circuit board utilizing an integrated circuit package in accordance with an illustrative embodiment of the present invention.

With reference now to the Figures, FIG. 1 is a block diagram of an integrated circuit 102, also called a chip, coupled to a printed circuit board 104, also called a substrate, utilizing an integrated circuit package 106 in accordance with an illustrative embodiment of the present invention.

Figure 2:
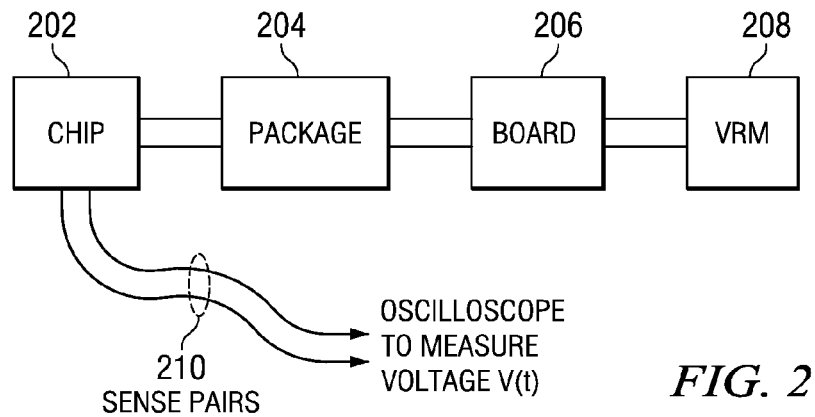
FIG. 2 is a block diagram of exemplary components that may be used to implement aspects of the present invention.

FIG. 2 is a block diagram of exemplary components used to implement aspects of the present invention. Microprocessor chip 202 is coupled to a printed circuit board 206 utilizing an integrated circuit package 204 in accordance with an illustrative embodiment of the present invention. Printed circuit board 206 is coupled to voltage regulator module (VRM) 208, which senses the microprocessor chip's requirements and ensures that the correct voltage is maintained. The voltage output of microprocessor chip 202 is provided to a voltage measuring device, such as sense pairs 210, which measure the voltage of the chip as a function of time ($V(t)$) using an oscilloscope. Thus, when a pseudo-impulse is generated, the sense pairs measure the on-chip voltage $V(t)$ using the oscilloscope. Repetitive pseudo-impulses are usually generated so that the oscilloscope may use internal averaging to reduce random noise from the oscilloscope and the probe. Once $V(t)$ is determined, the Fourier transformation of $V(t)$ translates the voltage into the frequency domain, or $V(f)$. Although it is relatively easy to obtain the voltage of the power supply system using the sense pairs, it can be difficult to directly measure the current $I(t)$ of the power supply system, since there are multiple currents within an active chip, and thus there is no one localized point to directly measure the current of the power supply system.

Figure 3:
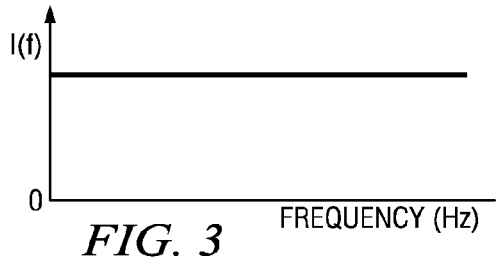
FIG. 3 is a graph of the Fourier transform of an ideal impulse current.

An impulse $$I(t) = \delta(t) = \begin{cases} 0 & \text{for } t \neq 0 \\ \infty & \text{for } t = 0 \end{cases}$$

represents an ideal impulse current. The Fourier transformation of such as ideal impulse current is flat, as shown in FIG. 3, where the x-axis represents the frequency of the current, and the y-axis represents the current in the frequency domain $I(f)$. Although the current $I(f)$ is constant at all frequencies for an ideal impulse current, an ideal impulse current is impossible to generate. In reality, only non-ideal impulse currents can be generated. Fourier transformations of non-ideal impulse currents are not flat, and instead will fall off at higher frequencies.

In order to determine the current in the frequency domain $I(f)$ and obtain the impedance $Z(f)$ of the power supply system, embodiments of the present invention design and generate a non-ideal pseudo-impulse current. A pseudo-impulse current is an impulse-like current that has narrow but finite width and is due to the simultaneous switching of transistors from a clock edge.

Figure 4:
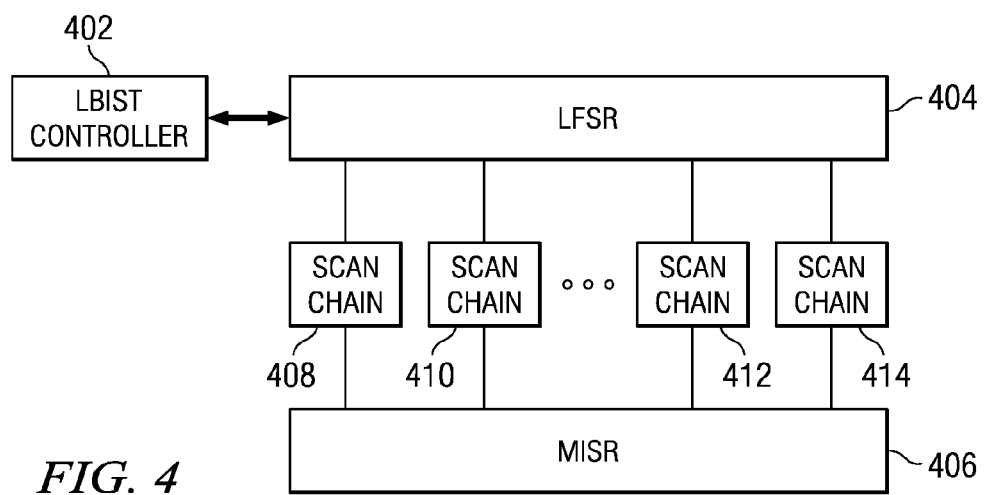
FIG. 4 is a diagram illustrating a logic built-in self test (LBIST) architecture used to generate a pseudo-impulse response in accordance with an illustrative embodiment of the present invention.

FIG. 4 is a diagram illustrating a logic built-in self test (LBIST) architecture that may be used to generate a pseudo-impulse response in accordance with an illustrative embodiment of the present invention.

LBIST technology is used in Application Specific Integrated Circuit (ASIC) chip designs and microprocessor chip designs since it can shorten testing times and minimize the cost of Automatic Test Pattern Generation (ATPG). The LBIST architecture most widely used to apply patterns and observe responses on a chip is the STUMPS (Self-Testing Using MISR and Parallel Shift) register sequence generator. STUMPS uses a Pseudo-Random Pattern Generator (PRPG) to generate the inputs to a chip's internal scan chain, initiate a functional cycle to capture the response of the device, and then compress the captured response into a Multiple Input Signature Register (MISR). The compressed response output from the MISR is then compared to golden results to detect any defects in the chip. Although the LBIST technique scans data in through the scan chain and then performs a test, only a scan of the data into the scan chain is needed to generate a pseudo-impulse response in accordance with the present invention.

STUMPS LBIST architecture 400 in FIG. 4 comprises LBIST controller 402, pseudo-random pattern generator/linear feedback shift register (PRPG/LFSR) 404, a multiple input signature register (MISR) 406, and scan chains (called channels) 408–414. STUMPS LBIST architecture 400 may also comprise XOR circuitry (or other simple combinational circuitry) placed between the channels, the PRPG/LFSR, and the MISR.

Consider, for example, a single scan chain of a scan shift used to generate a pseudo-impulse response. Each scan chain, such as scan chain 408, comprises N latches (N>>1) and each latch is clocked by a CLK signal. Although latches may also be controlled by a HOLD signal, in this particular implementation, the CLK signal is used to explain pseudo-impulse generation. At each clock edge, bit information stored in each latch is simultaneously moved down the chain by one latch. Alternating "1" and "0" bits are scanned into the chain. When the scan chain is full and further alternating "1" and "0" bits are being scanned, with an even number of latches (N is even), there are N/2 latches switching from HIGH to LOW and N/2 latches switching from LOW to HIGH at each clock edge. If N is odd but much larger than 1 (N>>1), there are (N−1)/2~(N+1)/2~N/2 latches switching at the opposite directions. If the number of latches in the scan chain is large (N>>1), then there is no significant difference as to whether N is even or odd, and there are approximately N/2 latches switching at opposite directions at each clock cycle. These switchings will dump the same amount of pseudo-impulse current on ground (GND) and power (PWR). Another important observation is that the scan chain remains approximately in the same state after each scan-in. Since the scan chain remains in the same state, nearly identical switchings (therefore, identical pseudo-impulse currents) may be repeated at each scan shift to generate repetitive pseudo-impulse responses.

The actual LBIST scanning process is more complicated than a single scan chain discussed above. The data input to scan chains are not the ideal alternating "0" and "1", but rather, the data input is generated by the pseudo-random pattern generator (PRPG). However, since the number of latches in all of the scan chains on the chip is very large, statistically, at any switching, there is an equal number of latches switching and generating identical pseudo-impulse currents. This process of generating pseudo-impulse currents may also be repetitive.

When measuring the impedance of the system, a user may design a switching charge that may generate a pseudo-impulse with a narrow width in the time domain. A narrow width pseudo-impulse comprises a width size not larger than the inversion of the maximum frequency of interest. As previously mentioned, the frequency of interest for an impedance profile may include frequencies between ~100 kHz to ~1 GHz. The inversion of the maximum frequency of interest, or 1/1 GHz, equals 1 nanosecond (nS). Thus, in this example, the width size of the pseudo-impulse current in the time domain must be smaller than 1 nS.

It should be noted that clock circuitry may be employed to generate the pseudo-impulse as an alternative to using a scan shift. For example, when the chip is in bypass mode, an external signal, such as from a clock generator, may be used to stimulate the clock circuitry and cause the clock circuitry to switch. The switch of the clock circuitry generates the pseudo-impulse at each clock cycle edge.

FIG. 5 depicts an RC circuit illustrating how the narrow width of the pseudo-impulse is based on the switching of transistors. To measure current I(t) in the time domain 502, on-chip signal switching can act as a capacitor 504 discharging through a resistor 506, as shown in the diagram of RC circuit 400 in FIG. 5. Current I(t) 502 of such a non-ideal impulse may be represented as follows:

$$I(t) = C_o * e^{-t/\tau}, \tau = RC$$

where $C_0$ is capacitance, t is a cycle time, and $\tau$ is time constant RC. For a microprocessor running at a particular frequency, capacitor 504 needs to be discharged before the next cycle occurs in order for the microprocessor to function properly. Thus, if a microprocessor chip runs at a frequency $f_0 = 1/T_0$, where $T_0$ is the cycle time period, $T_0/\tau$ must be larger than 1 since the impulse must be able to complete before the occurrence of the next cycle. Therefore, in the expression above, the time constant RC must be much smaller than the time period $T_0$.

FIGS. 6A–6C are graphs illustrating Fourier spectrums of example pseudo-impulses in accordance with an illustrative embodiment of the present invention. In particular, FIGS. 6A–6C illustrate frequency spectrums created for various values for $T_0/\tau$ using the equation for the impulse current I(t) above, wherein each value is larger than 1. FIG. 6A shows a frequency spectrum where $T_0/\tau$ has a value of 3. FIG. 6B shows a frequency spectrum where $T_0/\tau$ has a value of 5. FIG. 6C shows a frequency spectrum where $T_0/\tau$ has a value such that the spectrum is linear. As each figure shows, as long as the impulse current I(t) has a narrow width, there is no significant dependence of the normalized Fourier transform I(f) on the detailed behavior of I(t). This argument is true for high frequencies (~GHz) as well as for low frequencies (~MHz)—only the time scales are different.

Once the switching charge has been designed, a mechanism such as a scan shift may generate the switching charge, which in turn generates the desired narrow-width pseudo-impulse. Sense pairs connected to the chip may use an oscilloscope to measure the voltage in time domain V(t) of the pseudo-impulse. Once V(t) is determined, a Fourier transformation translates V(t) to voltage in the frequency domain V(f).

To determine the current in the frequency domain I(f), the mechanism of the present invention predicts the normalized Fourier transformation of the current I(f)/I(0). The mechanism of the present invention predicts the normalized behavior of the current at this point since the frequency component of the current at zero frequency I(0) is still unknown.

FIG. 7 is a graph illustrating an exemplary normalized Fourier Spectrum of a pseudo-impulse in accordance with an illustrative embodiment of the present invention is shown. The values on the x-axis represent the frequency (Hz) of the pseudo-impulse, and the y-axis represents the normalized Fourier transformation of the pseudo-impulse. In this illustrative example, the time period value of $T_0$ is 0.5 nS. At low frequencies, the curve representing normalized Fourier transformation looks similar to the ideal Fourier transformation graph shown in FIG. 3. However, at high frequencies, the current decreases and drops off.

As shown, the normalized Fourier transformation of the current I(t) up to a maximum frequency (e.g., 1 GHz) does not significantly depend upon the exact current waveform assumption. Thus, one can, up to a certain width, predict the normalized Fourier transformation of the current.

For example, if a microprocessor chip runs at a frequency $f_0=1/T_0$, where $T_0$ is the cycle time period, the normalized Fourier transformation of the current in the time domain may be predicted at low frequency (as ω approaches 0) using the pseudo-impulse, as shown below:

$$I(\omega)|_{\omega \to 0} = \lim_{\omega \to 0} \frac{1}{\sqrt{2\pi}} \int_{-\infty}^{+\infty} I(t) * e^{-i\omega t} dt$$

$$= \frac{1}{\sqrt{2\pi}} \int_{-\infty}^{+\infty} I(t) * \left(\lim_{\omega \to 0} e^{-i\omega t}\right) dt$$

$$= \frac{1}{\sqrt{2\pi}} \int_{-\infty}^{+\infty} I(t) * dt$$

$$= \frac{Q_0}{\sqrt{2\pi}} \text{ where charge } Q_o = \int_{-\infty}^{+\infty} I(t) * dt$$

The normalized Fourier transformation of the current is dependent upon the switching charge ($Q_0$) involved in the pseudo-impulse response. $Q_0$ is the amount of current switched during each pseudo-impulse response. At low frequency (as ω approaches 0), the limit of the expression is $I(\omega)=Q_0/\sqrt{2\pi}$, where $Q_0$ is defined as the integration of the current over time I(t)*dt. Thus, to measure the current at zero frequency I(0), one must first measure the switching charge $Q_0$.

The switching charge may be represented in the following manner $Q_0 = \Delta I * \Delta T$ where $Q_0$ is the amount of charged switched during each pseudo-impulse, $\Delta I$ is the stable state current, and $\Delta T$ is the time period between each pseudo-impulse. To determine the switching charge $Q_0$, one may use a repetitive pseudo-impulse. A repetitive pseudo-impulse allows for measuring the stable state of the current. In contrast with a single impulse as shown in FIG. 8A, a repetitive pseudo-impulse is used since it is difficult to measure the switching charge with a single impulse as a single switching charge occurs too quickly to be measured. The pseudo-impulse repeats at a specified time period $\Delta T$, as shown in FIG. 8B. With a pseudo-impulse sequence repeating at a specified time period $\Delta T$, one may obtain the current increase $\Delta I$. As the current increase $\Delta I$ and the change in time period $\Delta T$ is known, one may obtain the switching charge value $Q_0$.

Using the measured switching charge $Q_0$, one may now obtain a Fourier transformation of the current at zero frequency I(0). The current at any frequency of interest I(f) may be determined, since the normalized Fourier transformation of the current I(f)/I(0) is known and the current I(0) has been measured.

Figure 9:
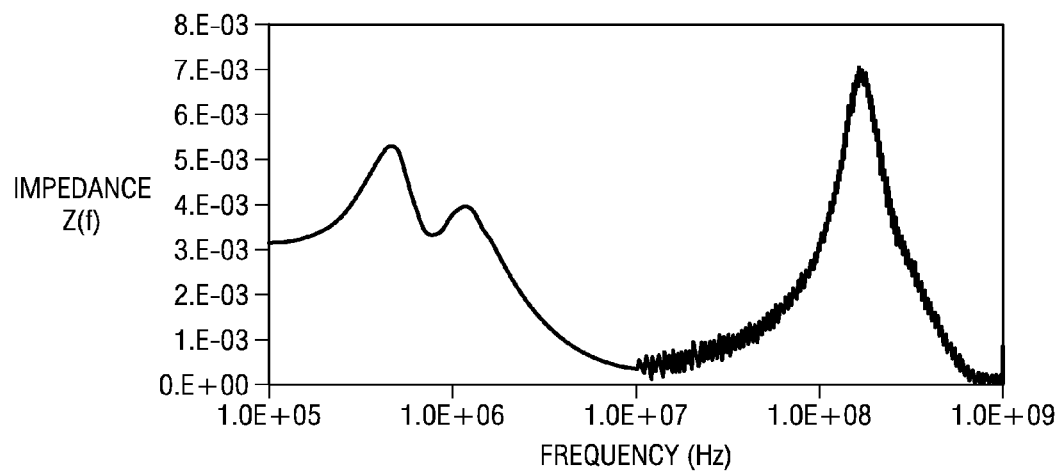
FIG. 9 is a graph illustrating an exemplary impedance profile in accordance with an illustrative embodiment of the present invention.

Since both the voltage V(f) and the current I(f) in the frequency domain known, impedance Z(f) of the power supply system may be obtained. An example of an impedance profile of a chip/package/board power supply system obtained using a pseudo-impulse of narrow width is shown in FIG. 9. In the example in FIG. 9, two measurements have been performed to cover the full frequency range.

Figure 10:
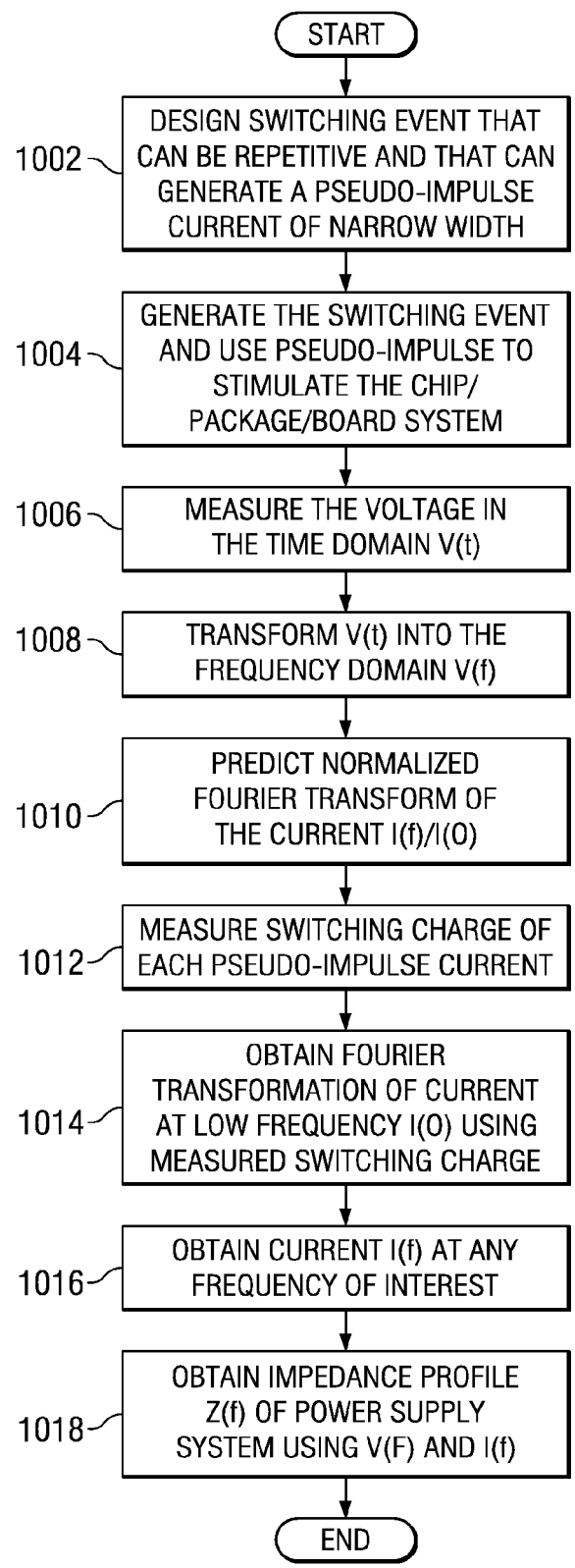
FIG. 10 is a flowchart of a process for measuring impedance of microprocessor chips, circuit boards, and electronic packaging using a pseudo-impulse response.

Turning next to FIG. 10, a flowchart of a process for measuring impedance Z(f) using a pseudo-impulse in accordance with an illustrative embodiment of the present invention is shown. To measure the impedance of the power supply system where Z(f)=V(f)/I(f), values must be obtained for V(f) and I(f). The process begins with the mechanism of the present invention designing a switching event that is repetitive and that can generate a pseudo-impulse current with a narrow but finite width (step 1002). One example of such a switching event is a LBIST scan shift. The scan shift is then used to generate the switching event and use the resulting pseudo-impulse current of narrow width to stimulate the chip/package/board system (step 1004).

To obtain the voltage in the frequency domain V(f), the mechanism of the present invention measures the voltage in the time domain V(t) of the generated repetitive pseudo-impulses from sense pairs using an oscilloscope (step 1006), and then determines the voltage in the frequency domain V(f) through the Fourier transform of V(t) (step 1008). The Fourier transformation of V(t) may be performed by the oscilloscope or by post-processing the measured V(t) data. In addition, internal averaging may be used to reduce random noise from the oscilloscope and probes.

To determine the current in the frequency domain I(f), the mechanism of the present invention predicts the normalized Fourier transformation of the current I(f)/I(0) (step 1010). The normalized factor of the current I(0) is the current I(f) at zero frequency. This prediction may be made based on having a designed impulse current of narrow width.

The predicted normalized Fourier transformation of the current I(f)/I(0) is dependent upon the switching charge $Q_0$ of the pseudo-impulse. The switching charge $Q_0$ of each pseudo-impulse is measured by repeating the switching charge and measuring the change in current $\Delta I$ within a particular time period $\Delta T$ (step 1012).

Once the switching charge is known, the mechanism of the present invention obtains the current at zero frequency I(0) using the measured switching charge (step 1014). The mechanism of the present invention then obtains the current I(f) at any frequency of interest (e.g., 100 kHz to ~1 GHz) (step 1016), since the current I(f)/I(0) is known and I(0) is measured.

As V(f) and I(f) are known, the mechanism of the present invention obtains the impedance profile Z(f) of the power supply system using the equation Z(f)=V(f)/I(f), and the phase information of Z(f) may be acquired (step 1018).

Figure 11:
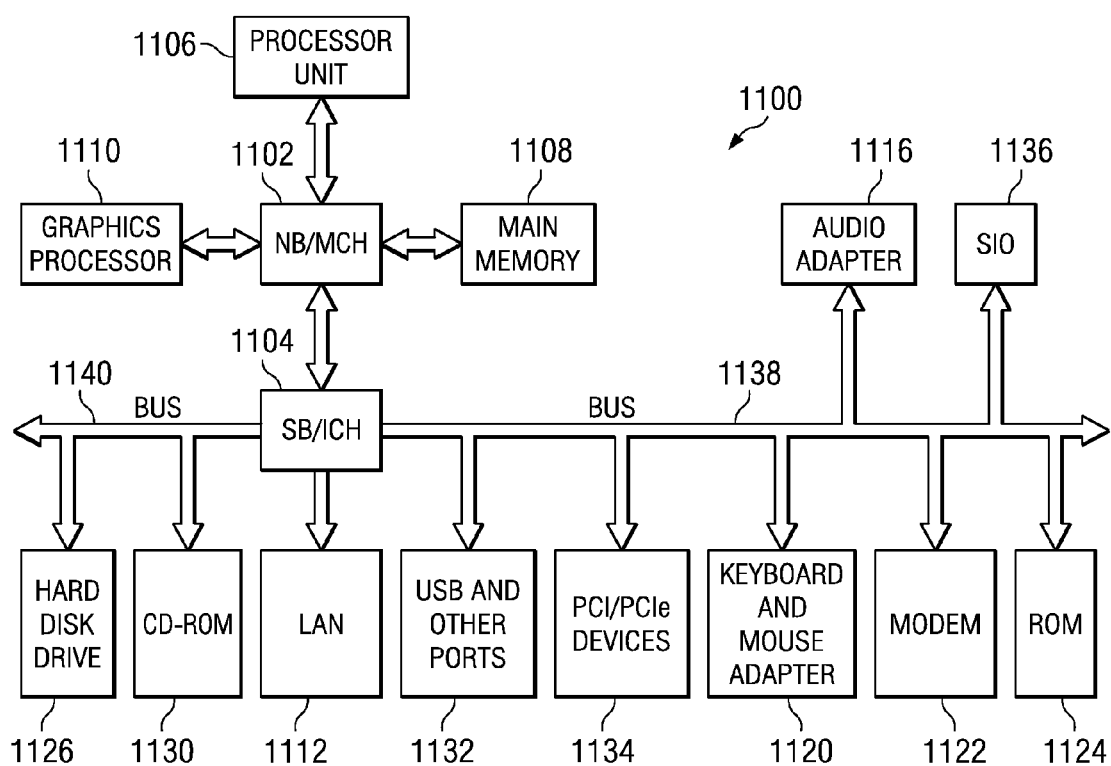
FIG. 11 is a block diagram of a data processing system in which aspects of the present invention may be implemented.

With reference now to FIG. 11, a block diagram of a data processing system is shown in which aspects of the present invention may be implemented. Data processing system 1100 is an example of a computer in which computer usable code or instructions implementing the processes for embodiments of the present invention may be located.

In the depicted example, data processing system 200 employs a hub architecture including north bridge and memory controller hub (NB/MCH) 1102 and south bridge and input/output (I/O) controller hub (SB/ICH) 1104. Processor unit 1006, main memory 1008, and graphics processor 1010 are connected to north bridge and memory controller hub 1102. Processor unit 1006 contains a set of one or more processors. When more than one processor is present, these processors may be separate processors in separate packages. Alternatively, the processors may be multiple cores in a package. Further, the processors may be multiple multi-core units.

In the depicted example, local area network (LAN) adapter 1112 connects to SB/ICH 1104. Audio adapter 1116, keyboard and mouse adapter 1120, modem 1122, read only memory (ROM) 1124, hard disk drive (HDD) 1126, CD-ROM drive 1130, universal serial bus (USB) ports and other communication ports 1132, and PCI/PCIe devices 1134 connect to SB/ICH 1104 through bus 1138 and bus 1140. PCI/PCIe devices may include, for example, Ethernet adapters, add-in cards, and PC cards for notebook computers. PCI uses a card bus controller, while PCIe does not. ROM 1124 may be, for example, a flash binary input/output system (BIOS).

HDD 1126 and CD-ROM drive 1130 connect to SB/ICH 1104 through bus 1140. HDD 1126 and CD-ROM drive 1130 may use, for example, an integrated drive electronics (IDE) or serial advanced technology attachment (SATA) interface. Super I/O (SIO) device 1136 may be connected to SB/ICH 1104.

An operating system runs on processor unit 1106 and coordinates and provides control of various components within data processing system 1100 in FIG. 11. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 1100 (Java is a trademark of Sun Microsystems, Inc. in the United States, other countries, or both).

As a server, data processing system 1100 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 1100 may be a symmetric multiprocessor (SMP) system including a plurality of processors in processor unit 1106. Alternatively, a single processor system may be employed.

Instructions for the operating system, the object-oriented programming system, and applications or programs are located on storage devices, such as HDD 1126, and may be loaded into main memory 1108 for execution by processor unit 1106. The processes for embodiments of the present invention are performed by processor unit 1106 using computer usable program code, which may be located in a memory such as, for example, main memory 1108, ROM 1124, or in one or more peripheral devices 1126 and 1130.

Those of ordinary skill in the art will appreciate that the hardware in FIG. 11 may vary depending on the implementation. Other internal hardware or peripheral devices, such as flash memory, equivalent non-volatile memory, or optical disk drives and the like, may be used in addition to or in place of the hardware depicted in FIG. 11. Also, the processes of the present invention may be applied to a multiprocessor data processing system.

In some illustrative examples, data processing system 1100 may be a personal digital assistant (PDA), which is configured with flash memory to provide non-volatile memory for storing operating system files and/or user-generated data.

A bus system may be comprised of one or more buses, such as bus 1138 or bus 1140 as shown in FIG. 11. Of course, the bus system may be implemented using any type of communication fabric or architecture that provides for a transfer of data between different components or devices attached to the fabric or architecture. A communication unit may include one or more devices used to transmit and receive data, such as modem 1122 or network adapter 1112 of FIG. 11. A memory may be, for example, main memory 1108, ROM 1124, or a cache such as found in NB/MCH 1102 in FIG. 11. The depicted example in FIG. 11 and above-described examples are not meant to imply architectural limitations. For example, data processing system 1100 also may be a tablet computer, laptop computer, or telephone device in addition to taking the form of a PDA.

Thus, aspects of the present invention provide a computer implemented method, data processing system, and computer program product for measuring the impedance profile of a microprocessor chip, electronic packaging, and circuit board power supply system using a pseudo-impulse response. The mechanism of the present invention provides advantages over existing methods by providing a method for measuring impedance that does not require one to manually filtered out the noise, take current measurements at different frequencies, no use a special circuit to perform the impedance measurements.

Furthermore, the circuit as described in FIG. 11 is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the illustrative embodiments have been presented for purposes of illustration and description, and is not intended to be exhaustive or limited to the illustrative embodiments in the form disclosed. Many modifications and variations will be apparent to those of ordinary skill in the art. The embodiment was chosen and described in order to best explain the principles of the illustrative embodiments, the practical application, and to enable others of ordinary skill in the art to understand the illustrative embodiments for various embodiments with various modifications as are suited to the particular use contemplated.

What is claimed is:

1. A computer implemented method for measuring impedance of a chip/package/board power supply system using a pseudo-impulse response, the computer implemented method comprising:

generating a pseudo-impulse current having a width size in a time domain not larger than an inversion of a maximum frequency of interest;

obtaining a voltage measurement in a frequency domain of the pseudo-impulse current;

predicting a normalized Fourier transformation of a current in a frequency domain, wherein the normalized Fourier transformation depends upon a switching charge of the pseudo-impulse current;

measuring the switching charge of the pseudo-impulse current;

obtaining a first current measurement at zero frequency using the measured switching charge;

obtaining a second current measurement at a frequency of interest using the first current measurement; and calculating an impedance of the chip/package/board power supply system using the voltage measurement and the second current measurement.

2. The computer implemented method of claim 1, wherein the pseudo-impulse current is generated using a repetitive switching event.

3. The computer implemented method of claim 2, wherein the repetitive switching event comprises a plurality of latches in a scan chain switching upon each scan of data.

4. The computer implemented method of claim 1, wherein the pseudo-impulse current is generated using a Logic Built-in Self Test scan shift technique.

5. The computer implemented method of claim 4, wherein the Logic Built-in Self Test scan shift technique generates the pseudo-impulse current by scanning data through a scan chain.

6. The computer implemented method of claim 1, wherein the pseudo-impulse current is generated using clock circuitry, wherein a switch of the clock circuitry generates the pseudo-impulse current at each clock cycle edge.

7. The computer implemented method of claim 1, wherein obtaining a voltage measurement further comprises:

using sense pairs to obtain the voltage measurement in the time domain; and performing a Fourier transformation of the voltage measurement in the time domain to obtain a measurement for voltage in the frequency domain.

8. The computer implemented method of claim 7, wherein the Fourier transformation is performed by an oscilloscope.

9. The computer implemented method of claim 1, wherein measuring the switching charge of the pseudo-impulse current includes:

repeating the pseudo-impulse current; and measuring the change in current within a particular time period.

10. The computer implemented method of claim 1, wherein obtaining a first current measurement at zero frequency is performed using the equation:

$$I(\omega)|_{\omega \to 0} = \lim_{\omega \to 0} \frac{1}{\sqrt{2\pi}} \int_{-\infty}^{+\infty} I(t) * e^{-i\omega t} \, dt$$

$$= \frac{1}{\sqrt{2\pi}} \int_{-\infty}^{+\infty} I(t) * \left( \lim_{\omega \to 0} e^{-i\omega t} \right) dt$$

$$= \frac{1}{\sqrt{2\pi}} \int_{-\infty}^{+\infty} I(t) * dt$$

$$= \frac{Q_0}{\sqrt{2\pi}} \text{ where charge } Q_o = \int_{-\infty}^{+\infty} I(t) * dt$$

where $I(\omega)$ is the normalized Fourier transformation of current $I(t)$, and switching charge $Q_0$ is the integration of current over time.

11. The computer implemented method of claim 1, wherein measuring the switching charge of the pseudo-impulse current is performed using the equation:

$$Q_0 = \Delta I * \Delta T$$

where $Q_0$ is an amount of charged switched during each pseudo-impulse, $\Delta I$ is a stable state current, and $\Delta T$ is a time period between each pseudo-impulse.

12. The computer implemented method of claim 1, wherein the frequency of interest includes frequencies between 100 kHz to 1 GHz.

13. A data processing system for measuring impedance of a chip/package/board power supply system using a pseudo-impulse response, the data processing system comprising:

a bus;

a storage device connected to the bus, wherein the storage device contains computer usable code;

at least one managed device connected to the bus;

a communications unit connected to the bus; and a processing unit connected to the bus, wherein the processing unit executes the computer usable code to generate a pseudo-impulse current having a width size in a time domain not larger than an inversion of a maximum frequency of interest, obtain a voltage measurement in a frequency domain of the pseudo-impulse current, predict a normalized Fourier transformation of a current in a frequency domain, wherein the normalized Fourier transformation depends upon a switching charge of the pseudo-impulse current, measure the switching charge of the pseudo-impulse current, obtain a first current measurement at zero frequency using the measured switching charge, obtain a second current measurement at a frequency of interest using the first current measurement, and calculate an impedance of the chip/package/board power supply system using the voltage measurement and the second current measurement.

14. A computer program product for measuring impedance of a chip/package/board power supply system using a pseudo-impulse response, the computer program product comprising:

a computer usable medium having computer usable program code tangibly embodied thereon, the computer usable program code comprising:

computer usable program code for generating a pseudo-impulse current having a width size in a time domain not larger than an inversion of a maximum frequency of interest;

computer usable program code for obtaining a voltage measurement in a frequency domain of the pseudo-impulse current;

computer usable program code for predicting a normalized Fourier transformation of a current in a frequency domain, wherein the normalized Fourier transformation depends upon a switching charge of the pseudo-impulse current;

computer usable program code for measuring the switching charge of the pseudo-impulse current;

computer usable program code for obtaining a first current measurement at zero frequency using the measured switching charge;

computer usable program code for obtaining a second current measurement at a frequency of interest using the first current measurement; and computer usable program code for calculating an impedance of the chip/package/board power supply system using the voltage measurement and the second current measurement.

15. The computer program product of claim 14, wherein the pseudo-impulse current is generated using a Logic Built-in Self Test scan shift technique.

16. The computer program product of claim 15, wherein the Logic Built-in Self Test scan shift technique generates the pseudo-impulse current by scanning data through a scan chain.

17. The computer program product of claim 14, wherein the computer usable program code for obtaining a voltage measurement further comprises:
  computer usable program code for using sense pairs to obtain the voltage measurement in the time domain; and
  computer usable program code for performing a Fourier transformation of the voltage measurement in the time domain to obtain a measurement for voltage in the frequency domain.

18. The computer program product of claim 14, wherein the computer usable program code for measuring the switching charge of the pseudo-impulse current further comprises:
  computer usable program code for repeating the pseudo-impulse current; and
  computer usable program code for measuring the change in current within a particular time period.

19. The computer program product of claim 14, wherein obtaining a first current measurement at zero frequency is performed using the equation:

$$I(\omega)|_{\omega \to 0} = \lim_{\omega \to 0} \frac{1}{\sqrt{2\pi}} \int_{-\infty}^{+\infty} I(t) * e^{-i\omega t} dt$$

$$= \frac{1}{\sqrt{2\pi}} \int_{-\infty}^{+\infty} I(t) * \left(\lim_{\omega \to 0} e^{-i\omega t}\right) dt$$

$$= \frac{1}{\sqrt{2\pi}} \int_{-\infty}^{+\infty} I(t) * dt$$

$$= \frac{Q_0}{\sqrt{2\pi}} \text{ where charge } Q_o = \int_{-\infty}^{+\infty} I(t) * dt$$

where $I(\omega)$ is the normalized Fourier transformation of current $I(t)$, and switching charge $Q_0$ is the integration of current over time.

20. The computer program product of claim 14, wherein measuring the switching charge of the pseudo-impulse current is performed using the equation:

$$Q_0 = \Delta I * \Delta T$$

where $Q_0$ is an amount of charged switched during each pseudo-impulse, $\Delta I$ is a stable state current, and $\Delta T$ is a time period between each pseudo-impulse.

* * * * *